United States Patent
Roman et al.

(12) 
(10) Patent No.: US 6,621,413 B1
(45) Date of Patent: Sep. 16, 2003

(54) WIRELESS MONITORING OF A MOBILE MAGNET

(75) Inventors: James P. Roman, Nashota, WI (US); Sean S. Josephson, Brookfield, WI (US); David M. Davenport, Niskayuna, NY (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 139 days.

(21) Appl. No.: 09/639,698

(22) Filed: Aug. 16, 2000

(51) Int. Cl.[7] .............................. G08B 1/08; A61B 5/00
(52) U.S. Cl. ...................... 340/539.12; 340/539.18; 340/825.36; 701/29; 379/38; 455/426.1; 600/300; 600/411; 128/903; 324/307
(58) Field of Search .................... 340/539, 531, 340/825.36, 825.49; 701/29, 30; 379/37, 38; 455/575, 426; 128/903, 904, 922; 430/39; 600/300, 410, 411; 324/318, 307, 309

(56) References Cited

U.S. PATENT DOCUMENTS

| | | | |
|---|---|---|---|
| 4,750,197 A | * | 6/1988 | Denekamp et al. .......... 455/404 |
| 4,804,937 A | | 2/1989 | Barbiaux et al. .......... 340/52 F |
| 5,005,126 A | * | 4/1991 | Haskin .......................... 378/4 |
| 5,223,844 A | * | 6/1993 | Mansell et al. ............. 342/357 |
| 5,400,018 A | | 3/1995 | Scholl et al. ........... 340/825.54 |
| 5,450,321 A | * | 9/1995 | Crane .......................... 307/10.6 |
| 5,808,907 A | | 9/1998 | Shetty et al. ........... 364/551.02 |
| 5,844,473 A | * | 12/1998 | Kaman ........................ 340/439 |
| 5,917,433 A | | 6/1999 | Keillor et al. .............. 340/989 |
| 6,377,162 B1 | * | 4/2002 | Delestienne et al. ... 340/286.07 |

FOREIGN PATENT DOCUMENTS

WO     WO 00/00840     1/2000

OTHER PUBLICATIONS

Marian L. Buszko et al., Internet Technology in Magnetic Resonance: A Common Gateway Interface Program for the World–Wide Web NMR Spectrometer Jan. 1998, pp. 362–366.

* cited by examiner

*Primary Examiner*—Donnie L. Crosland
(74) *Attorney, Agent, or Firm*—Foley & Lardner; Peter J. Vogel; Michael A. Della Penna

(57) ABSTRACT

A system and method of servicing a mobile magnet by wireless monitoring is provided. The mobile magnet has a sensor configured to sense a characteristic of the mobile magnet and a computer coupled to the sensor configured to receive sensor data representative of the sensed characteristic. The method includes receiving the sensor data at a remote monitoring station via a wireless communication link with the computer; determining whether the mobile magnet needs service based on the sensor data; and dispatching a service technician to the mobile magnet when the mobile magnet needs service.

22 Claims, 6 Drawing Sheets

SYSTEM — STATUS | DIAGNOSE | CONFIGURE

CURRENT VALUES — 96

| ITEM NAME | VALUE | UNITS | ALARM ON/OFF | STATUS |
|---|---|---|---|---|
| WATER FLOW | 2.918 | GPM | Y | OK |
| WATER TEMP. | 51.5 | DEG F | Y | OK |
| SHIELD TEMP. | 38.35 | K | Y | OK |
| SLEEVE TEMP. | 5.324 | K | Y | OK |
| RECONDENSER TEMP | 4.282 | K | Y | OK |
| COLDHEAD TEMP | 4.317 | K | Y | OK |
| HELIUM VESSEL PRESSURE | 3.898 | PSIG | Y | OK |
| NITROGEN LEVEL | 0 | % | N | OFF |
| HELIUM LEVEL | 98.9 | % | Y | OK |
| LCC PRESSURE CONTROL | HTR OFF | PSIG | N | OK |
| HELIUM LOSS/WEEK | 0 | %/WK | N | OFF |

108

| DIGITAL INPUTS | VAL |
|---|---|
| SYSTEM CABINET ON | 1 |
| RF UNBLANK | 0 |
| MAGNET QUENCH DETECTED | 0 |
| SAMPLE CRYOGEN PUSHBUTTON | 0 |
| FILL KEY SWITCH | 0 |
| PIZZA BD POWER ENABLED | 1 |
| COMPRESSOR +24VDC | 0 |
| COMPRESSOR FUSE OFF | 1 |
| COMPRESSOR ON | 1 |
| HELIUM TEMPERATURE HIGH | 1 |
| HELIUM PRESSURE LOW | 0 |
| KLIXON ERROR | 0 |
| DIGITAL OUTPUTS | VAL |
| COMPRESSOR RESET | 0 |
| PRESSURE HEATER ENABLE | 0 |

ROUTE: 250 MILES THROUGH CHICAGO W/AM45

| | | CONNECTIVITY DATA | | | | | | | | | | | |
|---|---|---|---|---|---|---|---|---|---|---|---|---|---|
| TIME | PLACE | ATTEMPTS | RT Tx/Rx RATE (BYTES/SEC) | AVG (ms) | % LOSS | H$_2$O FLOW (GPM) | H$_2$O TEMP (F) | SHIELD TEMP (F) | SLEEVE TEMP (K) | RECON TEMP (K) | COLDHEAD TEMP (K) | LHe PRESSURE (PSIA) | % LHe LEVEL | HEATER | COMPRESSOR |
| 8:42 | PRE-TRIP@MR PAD13 | 1 | 15.88 | 2519 | 0 | 2.886 | 51.36 | 38.79 | 5.324 | 4.271 | 4.249 | 4.026 | 98.78 | ON | ON |
| 11:53 | PAD13 ON GENERATOR | 1 | 15.85 | 2524 | 0 | 2.885 | 51.36 | 38.79 | 5.324 | 4.271 | 4.305 | 3.996 | 98.78 | OFF | ON |
| 12:23 | I-94 EAST BETWEEN GEMS AND MILWAUKEE-LIGHT RAIN CLOUDY | 3 | 15.85 | 2524 | 0 | 2.954 | 51.4 | 38.79 | 5.324 | 4.282 | 4.26 | 3.93 | 98.78 | OFF | ON |
| 12:49 | I-894 EAST | 3 | 15.92 | 2513 | 0 | 2.955 | 51.55 | 38.79 | 5.324 | 4.271 | 4.317 | 3.907 | 98.78 | OFF | ON |
| 1:28 | I-94 SOUTH BETWEEN MILWAUKEE AND CHICAGO | 2 | 15.82 | 2528 | 0 | 2.955 | 51.23 | 38.35 | 5.324 | 4.271 | 4.249 | 3.939 | 98.78 | ON | ON |
| 1:53 | I-294 SOUTH CHICAGO BYPASS | 2 | 15.10 | 2649 | 20 | 2.955 | 51.4 | 38.35 | 5.324 | 4.271 | 4.26 | 3.998 | 98.78 | ON | ON |
| 2:31 | I-94 NORTH DOWNTOWN CHICAGO | 1 | 15.16 | 2638 | 0 | 2.966 | 51.5 | 38.35 | 5.324 | 4.282 | 4.282 | 4.053 | 98.78 | ON | ON |
| 2:57 | I-94 NORTH DOWNTOWN CHICAGO | 2 | 15.23 | 2627 | 10 | 2.966 | 51.6 | 38.35 | 5.337 | 4.282 | 4.26 | 4.113 | 98.78 | OFF | ON |
| 3:20 | I-94 NORTH BETWEEN CHICAGO AND MILWAUKEE | 1 | 15.79 | 2533 | 0 | 2.965 | 51.62 | 38.79 | 5.337 | 4.282 | 4.26 | 4.09 | 98.78 | OFF | ON |
| 4:25 | I-94 NORTH DOWNTOWN MILWAUKEE | 1 | 15.79 | 2533.88 | 20 | 2.966 | 51.67 | 38.35 | 5.324 | 4.282 | 4.249 | 4.09 | 98.78 | OFF | ON |
| 5:00 | I-94 WEST BETWEEN MILWAUKEE AND GEMS | 1 | 15.13 | 2642.9 | 10 | 2.966 | 51.55 | 38.97 | 5.337 | 4.282 | 4.154 | 4.154 | 98.78 | OFF | ON |

FIG. 7

WIRELESS MONITORING OF A MOBILE MAGNET

CROSS-REFERENCE TO RELATED APPLICATIONS

Not Applicable.

STATEMENT REGARDING FEDERALLY SPONSORED RESEARCH OR DEVELOPMENT

Not Applicable.

FIELD OF THE INVENTION

The present invention relates generally to mobile magnet systems used in medical diagnostics. More specifically, the present invention relates to systems and methods of monitoring such mobile magnet systems.

BACKGROUND OF THE INVENTION

A mobile magnetic resonance imaging (mobile MRI) system provides medical imaging that is transportable for sale or lease to medical facilities in a variety of locations. The mobile MRI is mounted to a movable trailer and towed by a tractor or truck. The mobile MRI offers great convenience and flexibility for various medical diagnostic applications.

One challenge of the mobile MRI is cooling the magnet. The mobile MRI includes a cooling system filled with a coolant, such as, liquid helium. Several characteristics of the coolant must be monitored, including the coolant level, coolant temperature, and coolant pressure. In the conventional system, a data monitor stores this information and provides an alert when one of the coolant characteristics exceeds a predetermined threshold. An operator at the mobile MRI must then make a service call to a technician to have the mobile MRI serviced.

One drawback of this method of monitoring the mobile MRI is that a human operator must be present at all times to watch the data monitor. The mobile MRI sometimes experiences periods during which no human operator is actively watching the data monitor. For example, during travel to a medical facility or during temporary storage at a yard facility, no human operator is present to monitor the mobile MRI. Consequently, the coolant level is not always timely replaced and additional magnet repair and service is required due to unobserved coolant depletion.

Accordingly, there is a need for an improved system and method for monitoring mobile magnet systems. Further, there is a need for a system and method for monitoring a mobile magnet without the need for constant human supervision of the mobile magnet. Further still, there is a need for a centralized monitoring system of a plurality of mobile magnets to improve the timeliness and cost-effectiveness of mobile magnet service.

SUMMARY OF THE INVENTION

According to one exemplary embodiment, a method of servicing a mobile magnet is provided. The mobile magnet has a sensor configured to sense a characteristic of the mobile magnet and a computer coupled to the sensor configured to receive sensor data representative of the sensed characteristic. The method includes receiving the sensor data at a remote monitoring station via a wireless communication link with the computer; determining whether the mobile magnet needs service based on the sensor data; and dispatching a service technician to the mobile magnet when the mobile magnet needs service.

According to another exemplary embodiment, a wireless monitoring system for a mobile magnet installed on a mobile vehicle is provided. The mobile magnet has a sensor configured to sense a characteristic of the mobile magnet and a computer coupled to the sensor configured to store mobile magnet data representative of the sensed characteristic. The system includes a wireless transmitter, a wireless receiver, and a central computer. The wireless transmitter is coupleable to the computer and configured to receive the mobile magnet data from the computer, to convert the mobile magnet data to a format suitable for wireless transmission, and to transmit the converted mobile magnet data wirelessly. The wireless receiver is located remotely from the mobile magnet and is configured to receive the transmitted mobile magnet data. The central computer is coupled to the wireless receiver and is configured to store the mobile magnet data and to provide an indication whether the mobile magnet needs service.

According to yet another exemplary embodiment, a mobile magnet system includes a mobile magnet adapted for use in a medical diagnostic application, a coolant system configured to provide a coolant to the mobile magnet, and a plurality of sensors coupled to the coolant system configured to sense characteristics of the coolant system. The mobile magnet system further includes a data recorder coupled to the sensors and configured to store sensor data based on the sensed characteristics and a wireless transmitter coupled to the data recorder and configured to receive the sensor data, to convert the sensor data to a format suitable for wireless transmission, and to transmit the sensor data wirelessly to a remote central computer.

BRIEF DESCRIPTION OF THE DRAWINGS

The invention will become more fully understood from the following detailed description, taken in conjunction with the accompanying drawings, wherein like reference numerals refer to like parts, in which:

FIG. 5 is a diagram illustrating three display screens generated by the central computer of the system of FIG. 1;

FIG. 6 is a diagram illustrating a display screen generated by the central computer of the system of FIG. 1; and FIG. 7 is a table having data from exemplary mobile magnet monitoring applications.

DETAILED DESCRIPTION OF THE INVENTION

Figure 1:
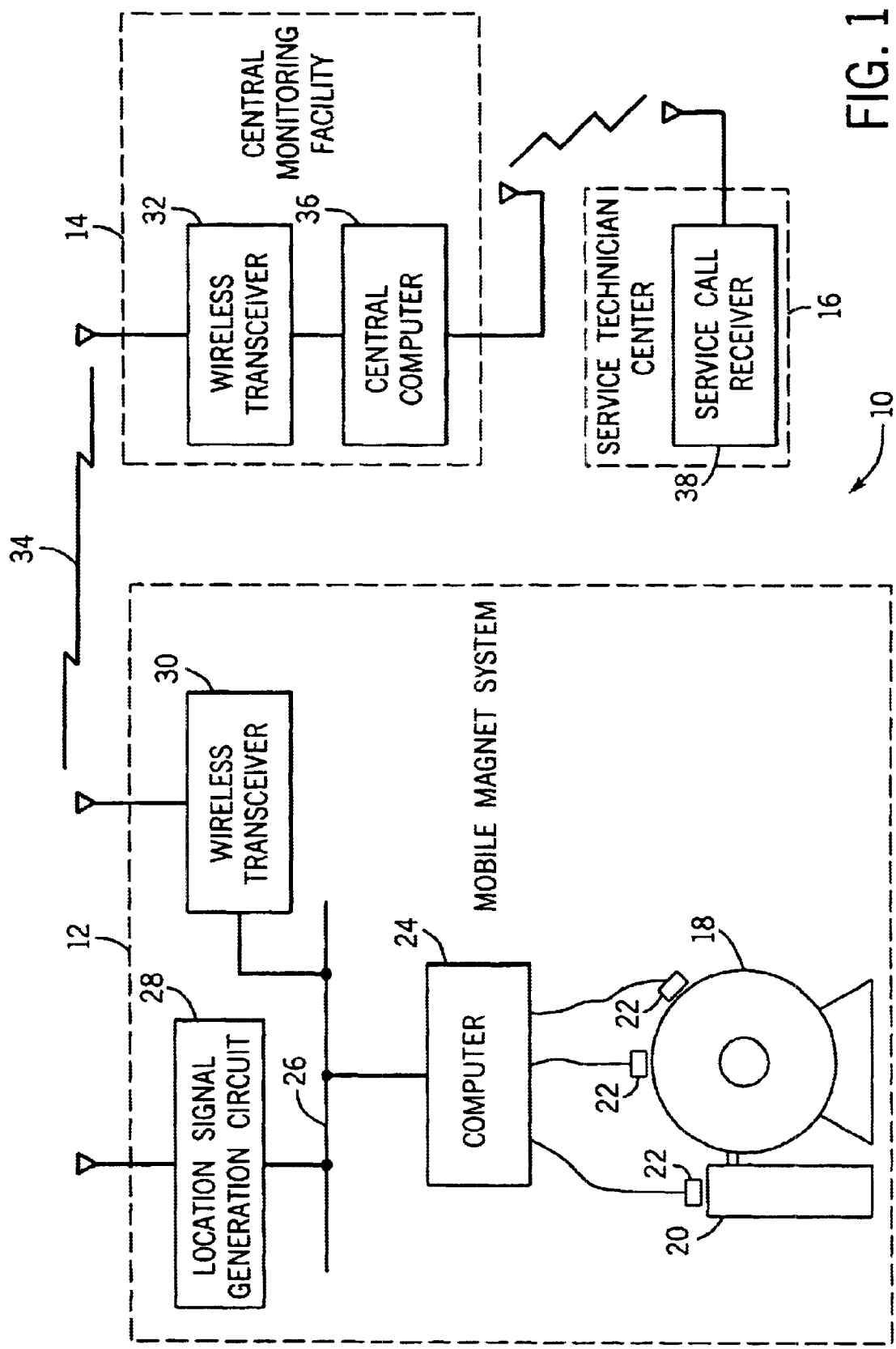
FIG. 1 is a simplified block diagram of a mobile magnet monitoring and service system according to an exemplary embodiment.

Referring first to FIG. 1, a mobile magnet monitoring and service system 10 is shown in block diagram form. System 10 includes a mobile magnet system 12, a central monitoring facility 14, and a service technician center 16. Mobile magnet system 12 includes a mobile magnet 18, such as the type used in a magnetic resonance imaging system, which is housed in a mobile apparatus, such as a wheeled trailer.

Mobile magnet system 12 is adapted to perform a medical procedure on a patient, such as an MRI or other diagnostic procedure. In this exemplary embodiment, mobile magnet system 12 is a GE True Mobile MR System, manufactured by General Electric Medical Systems, Milwaukee, Wis.

Mobile magnet system 12 further includes a cooling system 20 coupled to mobile magnet 18 configured to cool mobile magnet 18. In this exemplary embodiment, a liquid coolant, such as liquid helium, consumable coolant, water, or other coolant, is held in a reservoir within cooling system 20 and is pumped throughout mobile magnet 18 to cool the magnet core.

Mobile magnet system 12 further includes a plurality of sensors 22 positioned at various locations on or near magnet core 18 and/or cooling system 20 configured to sense various characteristics of mobile magnet 18. For example, sensors 22 may sense coolant level, coolant temperature, coolant pressure, cooling system status (e.g., compressor status, etc.), magnet system status, etc. Exemplary sensors include a system cabinet power monitor sensor, a compressor run state/temperature sensor (e.g., GE part number 2262271 manufactured by Sumitomo), a magnet heater state sensor (e.g., Sumitomo part number 668956 manufactured by Sumitomo Cryogenics/America), a magnet pressure sensor (e.g., American Magnetics part number 034603 manufactured by American Magnetics, Inc.), a magnet temperature sensor (e.g., Sumitomo part number 668956 manufactured by Sumitomo Cryogenics/America), and a magnet quench detector (e.g., GE Pacific PTE part number 878102 manufactured by GE Pacific PTE Ltd.). Sensors 22 may further sense other characteristics of mobile magnet 18 and other characteristics of mobile magnet system 12.

Sensors 22 are coupled to a computer 24. Computer 24 is a magnet monitor/data recorder in this exemplary embodiment, but may be any type of computing apparatus having digital and/or analog components, input/output ports, displays, etc. Computer 24 is configured to receive sensed signals from sensors 22 and to store sensor data or mobile magnet data based on the signals in an associated memory (e.g., a hard drive, magnetic tape, solid state memory, etc.).

Mobile magnet system 12 further includes a network (e.g., a local area network) or data bus 26 coupling computer 24 to a location signal generation circuit 28 and to a wireless transceiver 30. Network 26 further couples computer 24, circuit 28, and transceiver 30 to other co-located computer systems. Network 26 allows computer 24 to collect operational data not provided by sensors 22. This additional operational data can also be transferred to remote, central facility 14 to assist in prediction of service needs.

In this exemplary embodiment, location signal generation circuit 28 includes a global positioning receiver configured to receive satellite signals from a plurality of global positioning system satellites and to generate location data in latitude/longitude/elevation coordinates and to provide the location data to network 26. In alternative embodiments, location signal generation circuit 28 may utilize other navigational tools, such as, a wheel speed sensor, a gyroscope, a compass, other radio frequency signals (e.g., differential GPS signals, position triangulating signals, etc.), cellular phone signals, pager signals, wireless E-911 signals, etc. Location signal generation circuit 28 may be integral with wireless transceiver 30, or may include a separate receiver unit.

Mobile magnet system 12 further includes a wireless transceiver 30, an exemplary embodiment of which will be described in greater detail with reference hereinbelow to FIG. 3. Central monitoring facility 14 includes a similar wireless transceiver 32. Wireless transceiver 30 and wireless transceiver 32 are configured for uni- or bi-directional communication via communication link 34. Communication link 34 may include any wireless communication technology, including radio frequency, circuit-switched links provided by terrestrial cellular systems (e.g., AMPS, CDMA, TDMA, iDEN or GSM) as well as geostationary satellite networks (American Mobile Satellite Corporation, TMI Communications, Inmarsat, Globalstar), packet-switched links provided by terrestrial networks (Mobitex, DataTac, CDPD), and satellite networks (Norcom, AMSC, TMI, Inmarsat, Orbcomm, Qualcomm), etc. In this exemplary embodiment, a circuit-switched data link provided by American Mobile Satellite Corporation, Skycell, is utilized with a mobile satellite terminal, specifically, a Westinghouse Series 1000 Mobile Satellite Terminal, manufactured by Westinghouse Wireless Solutions Company. This satellite terminal provides nation-wide or even global coverage for data and voice services, which is particularly advantageous since mobile magnet system 12 may travel great distances.

Central monitoring facility 14 is at a location remote from mobile magnet system 12 and configured to communicate with a plurality of mobile magnet systems, such as, system 12. Facility 14 includes wireless transceiver 32 and a central computer 36. Central computer 36 includes suitable storage memory, input/output devices, and displays necessary to perform the functions described hereinbelow. Central computer 36 is further configured to communicate with a service call receiver 38 (e.g., a telephone, a wireless transceiver, a pager, etc.) at a service technician center 16 to dispatch a service technician in the vicinity of mobile magnet system 12 for service of mobile magnet 18. Alternatively, a human operator may operate central computer 36 and place a service request to service technician center 16 using any suitable communication medium, such as, a telephone, pager, etc.

According to one alternative, wireless transceiver 32 need not be located at facility 14. Rather, a terrestrial wired network connection may serve to couple central computer 36 with wireless transceiver 32 located at the wireless service provider facility (not shown). For this exemplary embodiment, wireless transceiver 32 resides at the AMSC ground station in Reston, Va. and the Public Switched Telephone Network (PSTN) is used to couple computer 36 to wireless transceiver 32.

In operation, computer 24 is configured to monitor one or more characteristics (e.g., coolant level, coolant temperature, coolant pressure, etc.) of mobile magnet 18 and/or coolant system 20 using sensors 22. Computer 24 is configured to receive sensor data (e.g., mobile magnet data) representative of the sensed characteristics and to store the sensor data in a volatile or non-volatile memory. Periodically (e.g., hourly, every few hours, daily, weekly, etc.), computer 24 provides the mobile magnet data to network 26. Alternatively, computer 24 may provide the mobile magnet data directly to wireless transceiver 30 via a separate bus. Transceiver 30 converts the mobile magnet data to a format suitable for wireless transmission, utilizing one of the wireless technologies set forth hereinabove, and transmits the converted mobile magnet data wirelessly via communication link 34 to wireless transceiver 32.

Figure 2:
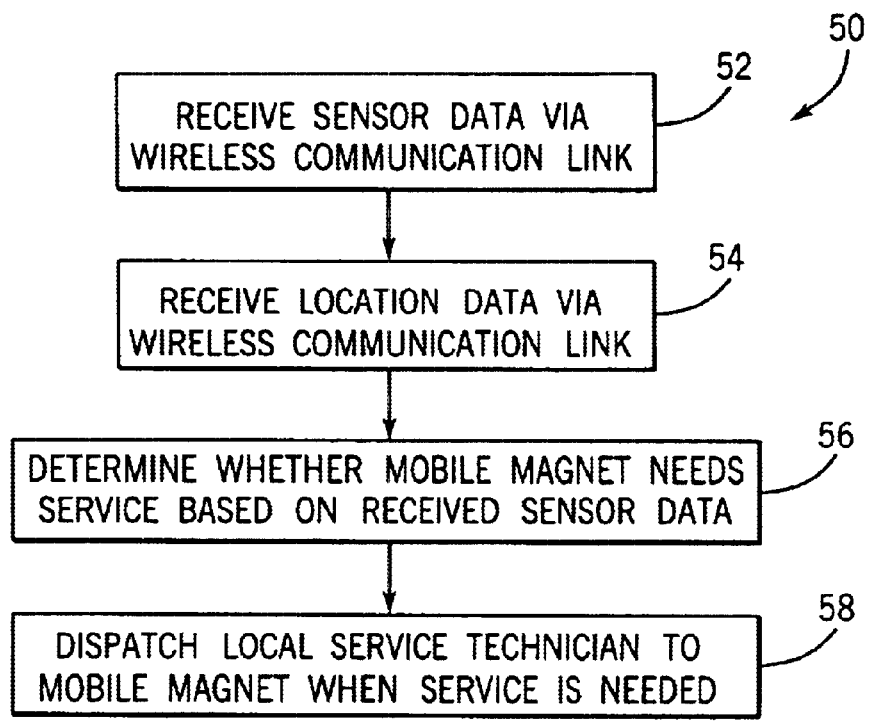
FIG. 2 is a flow chart of a method of servicing a mobile magnet according to an exemplary embodiment.

Referring now to FIG. 2, a method 50 of servicing mobile magnet system 12 using one or more components of system 10 will now be described. At step 52, central computer 36 receives the sensor data via the wireless communication link and stores the sensor data in a memory. At step 54, location data may also be received, as will be described hereinbelow.

At step 56, central computer 36 may perform various analysis and monitoring functions on sensor data when it is received. For example, central computer 36 can determine the condition of coolant circulating through mobile magnet 18 based on the sensor data. Central computer 36 can further predict, based on historical data, the next time mobile magnet system 12 will need service. Central computer 36 can further diagnose and categorize (e.g., by severity) various problems with mobile magnet system 12. For example, if coolant pressure suddenly drops significantly, central computer 36 can identify this drop as a serious problem. Based on step 56, a local service technician may be dispatched to mobile magnet system 12, as shown by step 58. For example, if a serious problem is identified, central computer 36 will make an immediate service call to service technician center 16 and indicate the level of urgency.

According to one alternative embodiment of step 56, computer 24 continuously monitors one or more characteristics of mobile magnet system 12 and, upon detecting a problem indicating a need for service, transmits mobile magnet data via wireless transceiver 30 to central computer 36. Computer 36 then may further diagnose the problem and, if necessary, make the necessary service call or calls to service technician center 16. Alternatively, computer 36 may directly make the necessary service call without further diagnosis, since computer 24 has already detected a problem indicating a need for service.

Computers 24 and 36 may operate autonomously or with the assistance of a human operator. According to one example, at step 56, computer 36 displays the raw sensor data received from wireless transceiver 32, and a human operator makes a determination whether mobile magnet 18 needs service. The human operator then contacts a service technician at a nearby service technician center 16 and orders a service call to mobile magnet system 12. Regardless of whether a human operator is used, the determination of whether service is required may be made in any number of ways, such as by comparing the mobile magnet data to a predetermined parameter or threshold. For example, if the level of a consumable coolant drops below a minimum consumable coolant level, service is needed to re-fill the consumable coolant. In this example, one human operator can monitor multiple mobile magnet systems from a single, central facility.

According to a further advantageous feature, location generation circuit 28 generates location data representative of the location of mobile magnet system 12 and provides the location data on network 26. Computer 24 receives the location data and provides the location data in a format suitable for transmission via wireless transceiver 30. Wireless transceiver 30 is configured to transmit the data either alone or in combination (i.e., juxtaposed) with each transmission of mobile magnet data to central monitoring facility 14 to provide spatial reference to the imaging system. Location data could be included in a log file and/or an alarm log of computer 24. Further, a position history file could be added into the log file structure of computer 24 to record the history of movement of system 12. This feature enables numerous advantageous functionalities. For example, an operator at central monitoring facility 14 could receive location data from computer 24 via wireless link 34 to determine where system 12 is and where it has been. Computer 24 could be configured for "location call-out" to allow system 12 to report a change in location periodically or at incremental distances, both of which would be configurable by remote programming or by a human operator resident in system 12. A remote operator at facility 14 could poll system 12 for position information and position history. Further, a human operator at system 12 could use position information to determine route optimization. Mobile magnet system 12 frequently moves from location to location and may move from the range of one service technician to another. Thus, the location data assists in identifying the nearest service technician center and further assists in instructing the service technician where mobile magnet system 12 is located. Thus, the spatial reference is leveraged to support location of the mobile system for timely and economical replenishment of coolant or other service events.

According to yet another advantageous feature, central computer 36 may provide data to mobile magnet system 12, utilizing wireless link 34 in a bi-directional embodiment. For example, computer 36 may provide sensor configuration data, computer software updates, transceiver configuration data, such as which frequency to use or which phone number to call, a system reboot command to perform a system reboot, a temporary power down command, reset alerts, etc.

Figure 3:
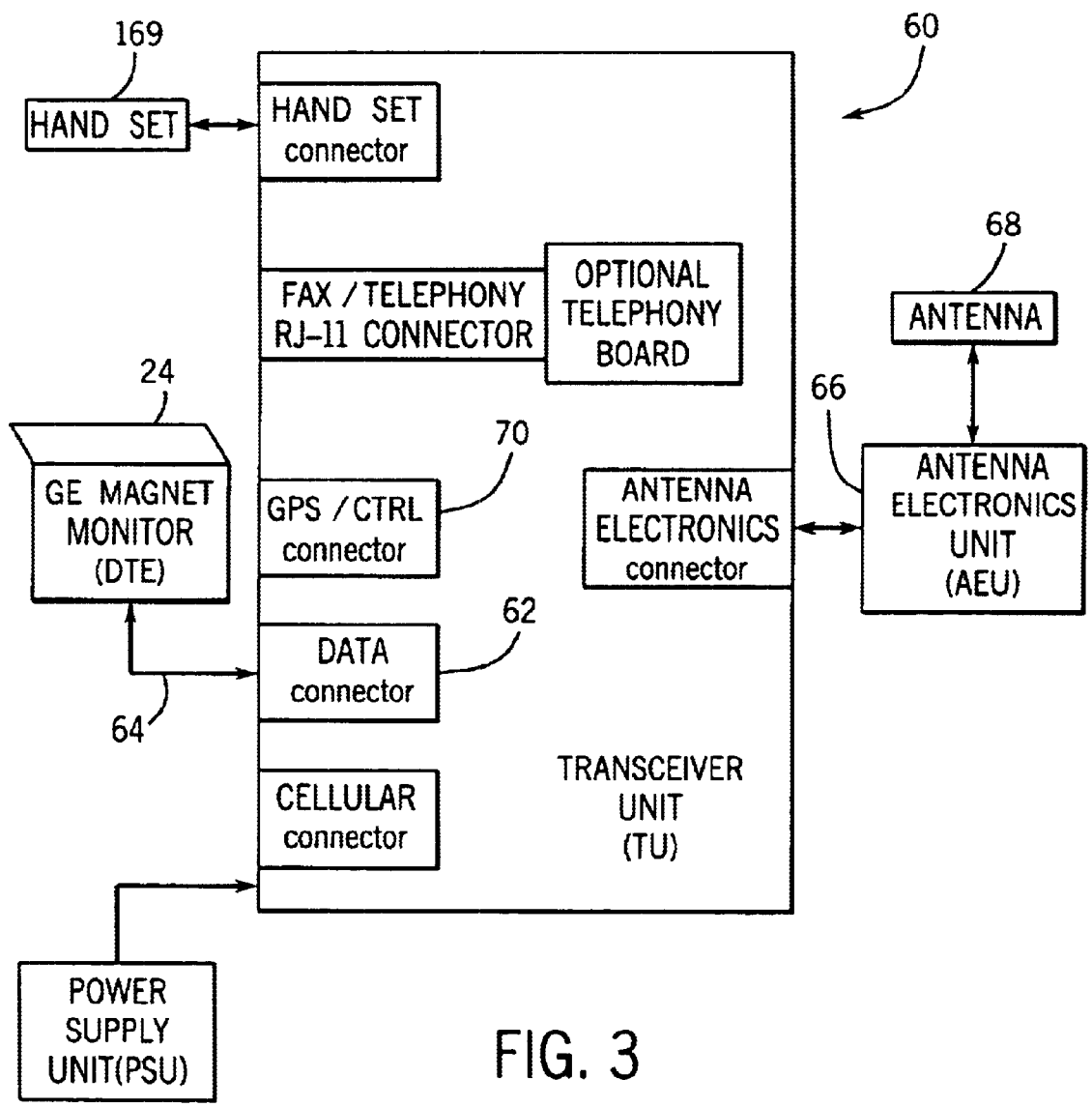
FIG. 3 is a block diagram of a transceiver unit for the system of FIG. 1.

Referring to FIGS. 3–7, a working example will now be described in detail. It is understood that the specific components and configuration recited herein are merely exemplary. Referring to FIG. 3, a wireless transceiver unit (TU) 60 which may be utilized for wireless transceiver 30 (and/or wireless transceiver 32) will now be described. In this exemplary embodiment, transceiver unit 60 is a Westinghouse Series 1000 transceiver using a mobile satellite, circuit-switched data channel, such as that provided by American Mobile Satellite Corporation. Computer 24 is configured to use an external modem and is coupled to transceiver unit 60 at data connector 62 using, for example, RS-232 cable 64. The Westinghouse Series 1000 transceiver provides standard modem interface and functionality including the Hayes AT Command Set. An antenna electronics unit (AEU) 66 is mounted in close proximity to transceiver unit 60 and within 15 feet of a high gain contoured dome antenna 68 (see also FIG. 4). Transceiver unit 60 further includes a GPS/CTRL connector 70 which may receive GPS data from location signal generation circuit 28 and display this GPS data on a handset 169. GPS/CTRL connector 70 further includes a jump between pins 6 and 1 on the CTRL port for un-commanded power-up initialization.

Figure 4:
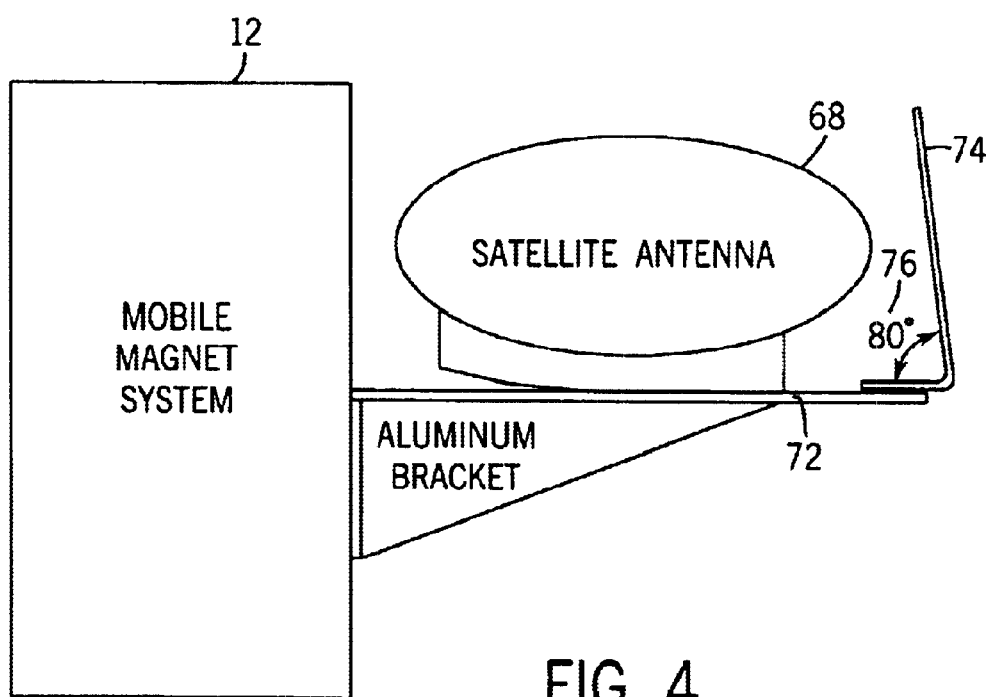
FIG. 4 is a diagram of a mounting for a transceiver antenna for the system of FIG. 1.

Referring now to FIG. 4, antenna 68 is mounted on the front of the wheeled vehicle (e.g., a van in this embodiment) forward of (at least one inch) and below air conditioning units associated with the van. Antenna 68 is mounted to an aluminum bracket 72 which is, in turn, mounted to the air conditioning units. The air conditioning units are shock mounted to the trailer (not shown) to minimize the vibration from the air conditioning units. A ¼-inch thick LEXAN resin shield 74 having a bend 76 of approximately 80 degrees protects antenna 68 from damage due to branches, birds, or other small objects that may strike the front of the van while moving at highway speeds. LEXAN is a trademark of and is manufactured by General Electric Plastics. Antenna 68 is mounted to provide adequate antenna look angle for satellite access in any direction of van travel anywhere in the continental United States.

Figure 5:
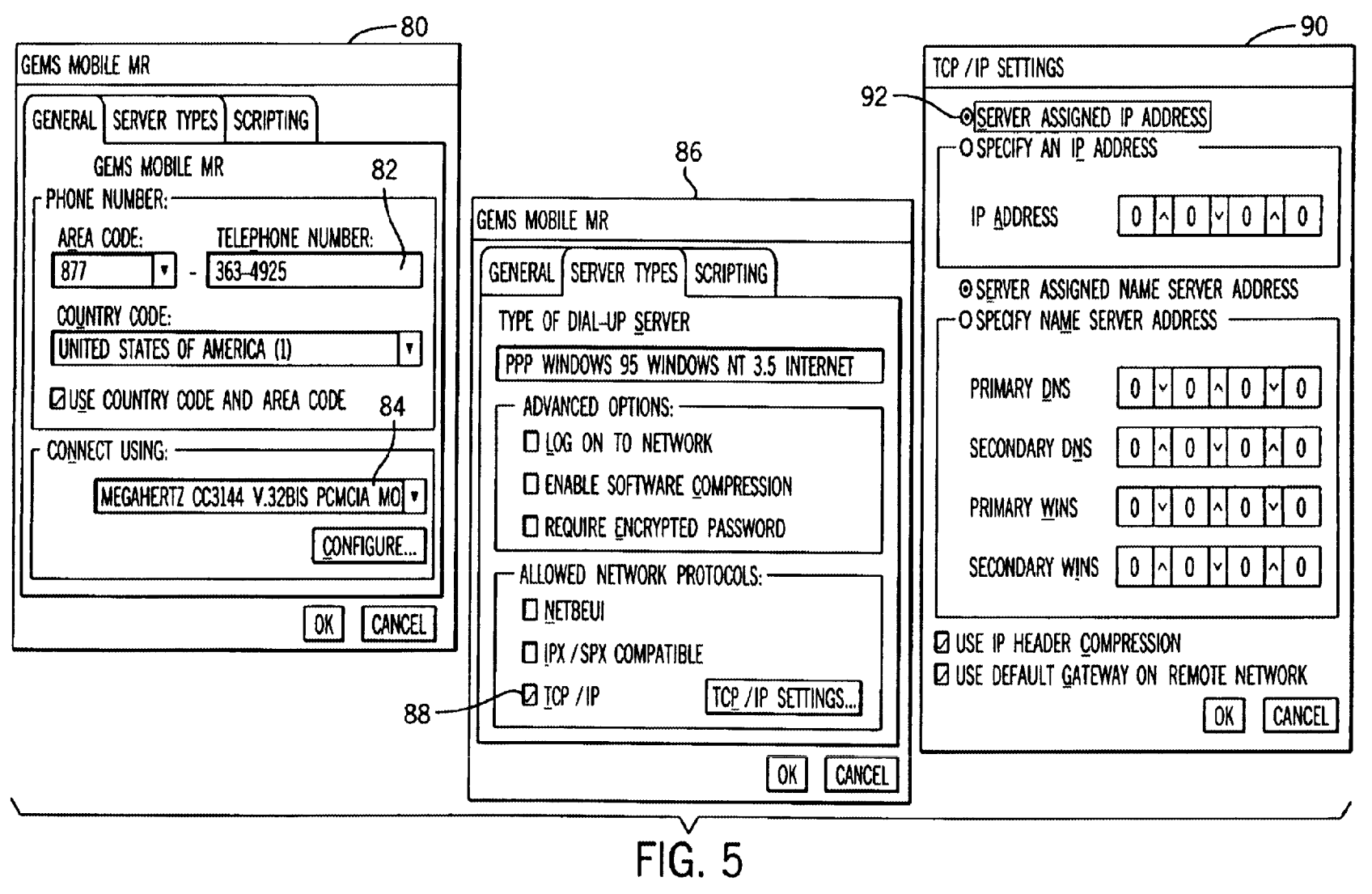

Referring now to FIG. 5, remote monitoring of system 12 in this working example was performed using a laptop PC running Microsoft Windows 95 as central computer 36. FIG. 5 illustrates three display screens utilized for establishing the dial-up, circuit-switched satellite connection. In the first screen 80, a telephone number associated with transceiver 30 is input in a telephone number field 82. A PCMCIA modem local to computer 36 is selected in field 84 configured for 4,800 bits per second, 8-N-1 format, hardware flow control, no error correction, terminal Windows post dial. In a second screen 86, TCP/IP protocol is selected at field 88. At a third screen 90, "server assigned IP address" is selected at field 92. The AMSC circuit switched data service allows connections to mobile wireless transceiver 32 via telephone or over the PSTN. Thus, the screens of FIG. 5 serve to configure the Windows 95 operating system of central computer 36 for the activation of such a telephone call. Following the initiation of such a PSTN call, the PCMCIA modem synchronizes with a modem at transceiver 32, then computers 24 and 36 establish a Point-to-Point (PPP) protocol link upon which TCP/IP protocol traffic may be exchanged.

Referring now to FIG. 6, after dial-up network configuration is complete, the laptop PC contacts wireless transceiver 30 via satellite. Transceiver 30 provides access to network 26. An operator then inputs a TCP/IP address to connect to computer 24. After the PPP network connection is established, data can now be accessed using TCP/IP-based applications (e.g., telnet, FTP, HTTP web browsing, etc.). Display screen 94 illustrates an example of HTTP web browser access.

Computer 24 is configured to provide sensor data in HTML file format in this exemplary embodiment, as shown in FIG. 6. A chart 96 has columns for item name 98, value 100, units 102, alarm on/off 104, and status 106. For example, water flow has a value of 2.918 GPM (gallons per minute) and the alarm is "Y" indicating "Off" and the status is OK. As another example, the nitrogen level is at 0% and the alarm is "N" indicating "On" or "Neutral" and the status is "Off". Additional data (e.g., MR system fault logs) is reported in a second table 108.

Referring now to FIG. 7, a table of several successful communication sessions utilizing the working example of FIGS. 3–6 is shown. The fourth column, labeled "RT Tx/Rx rate" indicates the time required for a data package to travel from computer 24 to central computer 36 and back again to computer 24. Several observations were made: 1. robust login scripting is required to establish automatic connections, 2. error detection and correction functionality is required as the mobile wireless environment was observed to induce data corruption, and 3. the data rate achieved (approximately 450 Bytes per second (BPS) to send data) was sufficient to support magnet monitoring.

While the exemplary embodiments illustrated in the FIGS. and described above are presently preferred, it should be understood that these embodiments are offered by way of example only. For example, the particular values, settings and speeds of the communication link will vary based on the hardware and software being used. Furthermore, a variety of wireless technologies are commercially available for such an implementation. Accordingly, the present invention is not limited to a particular embodiment, but extends to various modifications that nevertheless fall within the scope of the appended claims.

What is claimed is:

1. A method of servicing a mobile magnetic resonance imaging magnet, the mobile magnetic resonance imaging magnet having a sensor configured to sense a characteristic of the mobile magnetic resonance imaging magnet and a computer coupled to the sensor configured to receive sensor data representative of the sensed characteristic, comprising:

receiving the sensor data at a remote monitoring station via a wireless communication link with the computer that is coupled to the sensor of the mobile magnetic resonance imaging magnet;

determining whether the mobile magnetic resonance imaging magnet needs service based on the sensor data; and dispatching a service technician to the mobile magnetic resonance imaging magnet when the mobile magnetic resonance imaging magnet needs service.

2. The method of claim 1, further comprising receiving location data at the remote monitoring station via the wireless communication link, wherein the location data is representative of the location of the mobile magnet.

3. The method of claim 1, wherein the sensor data is received periodically.

4. The method of claim 1, wherein the sensor data is received only when the computer detects a need for service of the mobile magnetic resonance imaging magnet.

5. The method of claim 1, wherein the wireless communication link includes a satellite network.

6. The method of claim 1, wherein the sensor data is representative of at least one of coolant level, coolant temperature, and coolant pressure.

7. The method of claim 1, wherein the step of determining includes comparing the received sensor data to a predetermined parameter.

8. The method of claim 7, wherein the received sensor data is representative of a level of consumable coolant of the mobile magnetic resonance imaging magnet and the predetermined parameter includes a minimum consumable coolant level.

9. The method of claim 1, further comprising transmitting data via the wireless communication link from the remote monitoring station to the computer.

10. The method of claim 1, wherein the sensor data is generated by at least one of a compressor run state/temperature sensor, a magnet heater state sensor, a magnet pressure sensor, a magnet temperature sensor, and a magnet quench detector.

11. A wireless monitoring system for a mobile magnetic resonance imaging magnet installed on a mobile vehicle, comprising:

a mobile magnetic resonance imaging magnet;

a sensor configured to sense a characteristic of the mobile magnetic resonance imaging magnet;

a computer coupled to the sensor configured to store mobile magnetic resonance imaging magnet data representative of the sensed characteristic;

a wireless transmitter coupled to the computer configured to receive the mobile magnetic resonance imaging magnet data from the computer, to convert the mobile magnetic resonance imaging magnet data to a format suitable for wireless transmission, and to transmit the converted mobile magnetic resonance imaging magnet data wirelessly;

a wireless receiver located remotely from the mobile magnetic resonance imaging magnet configured to receive the transmitted mobile magnetic resonance imaging magnet data; and a central computer coupled to the wireless receiver configured to store the mobile magnetic resonance imaging magnet data and to provide an indication whether the mobile magnetic resonance imaging magnet needs service.

12. The wireless monitoring system of claim 11, wherein the sensor is at least one of a compressor run state/temperature sensor, a magnet heater state sensor, a magnet pressure sensor, a magnet temperature sensor, and a magnet quench detector.

13. The wireless monitoring system of claim 11, further comprising a location signal generation circuit configured to generate location data representative of an approximate location of the mobile magnetic resonance imaging magnet, wherein the wireless transmitter is configured to transmit the location data wirelessly.

14. The wireless monitoring system of claim 13, wherein the location signal generation circuit includes a global positioning system receiver.

15. The wireless monitoring system of claim 11, wherein the wireless transmitter includes a circuit switched satellite data terminal.

16. The wireless monitoring system of claim 11, wherein the stored mobile magnetic resonance imaging magnet data is representative of at least one of coolant level, coolant temperature, and coolant pressure.

17. The wireless monitoring system of claim 11, wherein the wireless transmitter is configured to transmit the mobile magnetic resonance imaging magnet data when service of the mobile magnetic resonance imaging magnet is needed.

18. The wireless monitoring system of claim 17, wherein the wireless transmitter is configured to transmit the mobile magnetic resonance imaging magnet data periodically.

19. The wireless monitoring system of claim 11, wherein the central computer is configured to provide data to the wireless receiver, wherein the wireless receiver includes an associated wireless transmitter configured to receive the data and to transmit the data wirelessly, wherein the wireless transmitter includes an associated wireless receiver configured to receive the data and to provide the data to the computer.

20. A mobile magnetic resonance imaging magnet system, comprising:

a mobile magnetic resonance imaging magnet adapted for use in a medical diagnostic application;

a coolant system configured to provide a coolant to the mobile magnetic resonance imaging magnet;

a plurality of sensors coupled to the coolant system configured to sense characteristics of the coolant system;

a data recorder coupled to the sensors configured to store sensor data based on the sensed characteristics; and a wireless transmitter coupled to the data recorder configured to receive the sensor data, to convert the sensor data to a format suitable for wireless transmission, and to transmit the sensor data wirelessly to a remote central computer.

21. The mobile magnetic resonance imaging magnet system of claim 20, further comprising a location signal generation circuit configured to generate location data representative of the approximate location of the mobile magnetic resonance imaging magnet system, wherein the wireless transmitter is configured to receive the location data, to convert the location data to a format suitable for wireless transmission, and to transmit the location data wirelessly to the remote central computer.

22. The mobile magnetic resonance imaging magnet system of claim 20, wherein the wireless transmitter is configured to transmit the sensor data both periodically and when the data recorder determines that service of the mobile magnetic resonance imaging magnet system is needed.

* * * * *